United States Patent [19]
Higashitani et al.

[11] Patent Number: 5,637,528
[45] Date of Patent: Jun. 10, 1997

[54] SEMICONDUCTOR DEVICE MANUFACTURING METHOD INCLUDING DRY OXIDATION

[75] Inventors: Masaaki Higashitani; Kenichi Hikazutani, both of Kawasaki, Japan

[73] Assignee: Fujitsu Limited, Kawasaki, Japan

[21] Appl. No.: 701,454

[22] Filed: Aug. 22, 1996

Related U.S. Application Data

[63] Continuation of Ser. No. 410,298, Mar. 24, 1995, abandoned.

[30] Foreign Application Priority Data

Apr. 22, 1994 [JP] Japan .................................. 6-084474

[51] Int. Cl.$^6$ .................................................. H01L 21/76
[52] U.S. Cl. ............................................. 438/452; 438/774
[58] Field of Search ............................ 437/69, 70, 72, 437/73, 174

[56] References Cited

U.S. PATENT DOCUMENTS 5,151,381  9/1992  Liu et al. ..................... 437/69

FOREIGN PATENT DOCUMENTS 2-260638  10/1990  Japan .

*Primary Examiner*—Trung Dang
*Attorney, Agent, or Firm*—Armstrong, Westerman, Hattori, McLeland & Naughton

[57] ABSTRACT

A method of manufacturing a semiconductor device including the steps of: (a) forming a mask layer of a desired pattern on a silicon substrate surface or on an $SiO_2$ strain absorbing layer formed on the silicon substrate surface; (b) selectively oxidizing the silicon substrate in a dry oxygen atmosphere by using the mask layer as an oxidation mask; and (c) selectively oxidizing the silicon substrate in an atmosphere of dry oxygen mixed with gas containing halogen element, wherein a field oxide film having a thickness of 100 nm or more is formed. The first and second oxidizing steps (b) and (c) are preferably performed at temperatures between 950° C. and 1200° C. A field oxide film with a short bird's beak can be formed while maintaining a relatively high oxidation speed and preventing generation of a white ribbon.

17 Claims, 6 Drawing Sheets

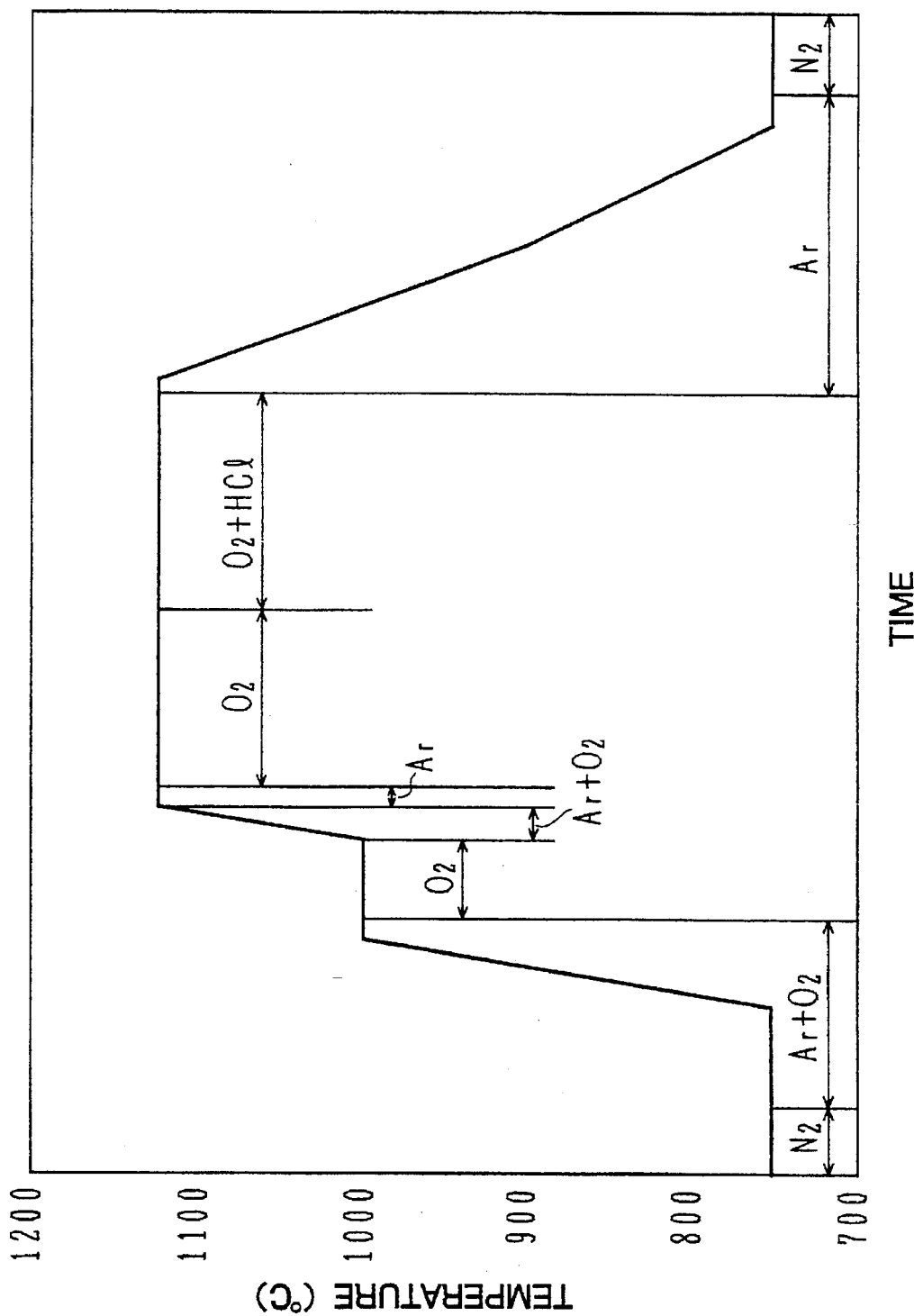

FIG.3C (REFERENCE)

FIG.3D (REFERENCE)

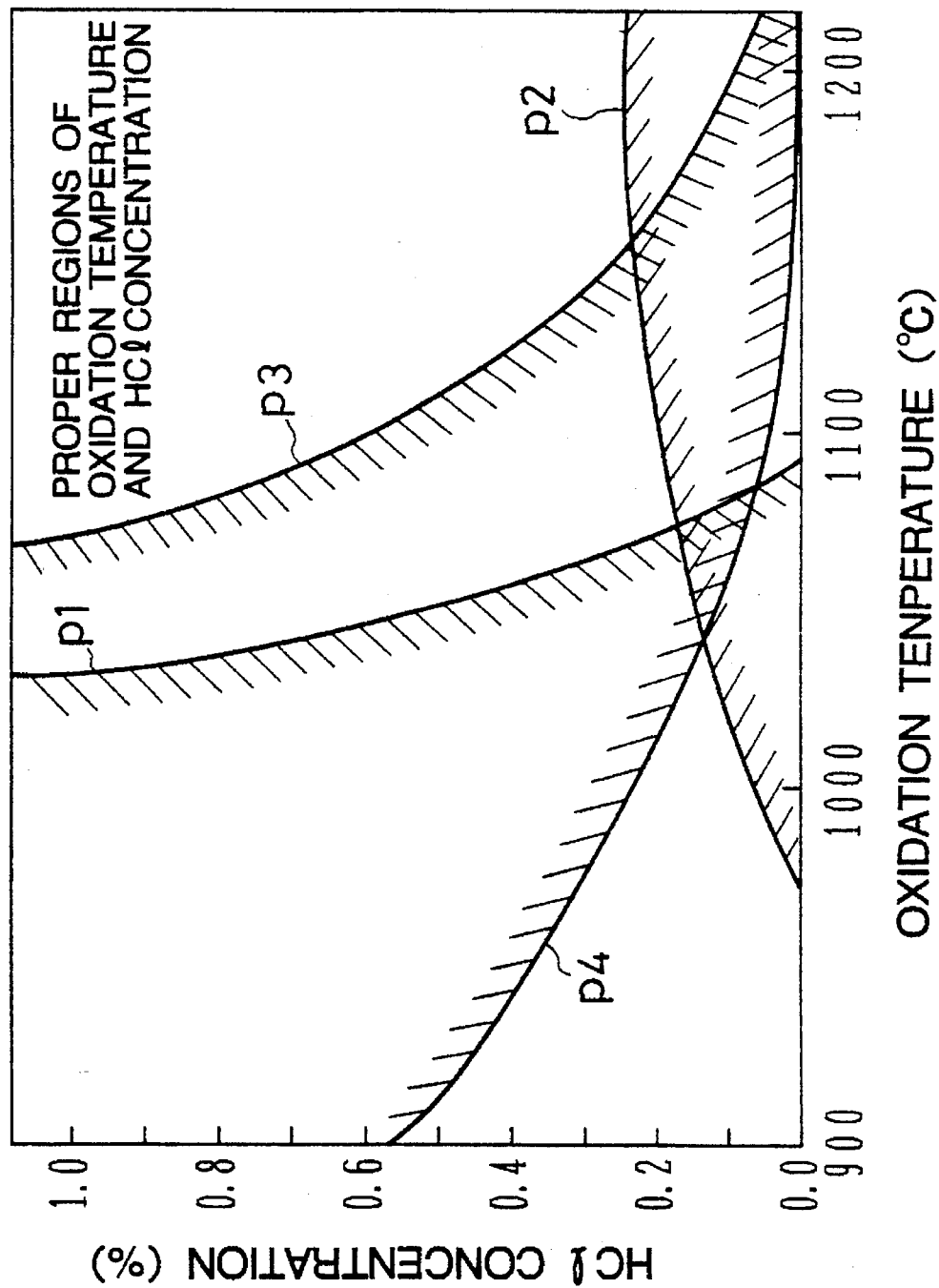

SEMICONDUCTOR DEVICE MANUFACTURING METHOD INCLUDING DRY OXIDATION

This application is a continuation application of Ser. No. 08/410,298 filed Mar. 24, 1995, now abandoned.

BACKGROUND OF THE INVENTION

1. Field of the Invention

The present invention relates to a method of manufacturing a semiconductor device, and more particularly to a method of forming a field oxide film for element isolation.

2. Description of the Related Art

Local oxidation of silicon (LOGOS) is widely used as an element isolation technique. A field oxide film Is required to be thicker than a gate oxide film or other films. A fast oxidation speed is required for a field oxide film so as to improve throughput. Wet oxidation has been therefore used conventionally.

In order to further speed up the oxidation speed, it is preferable to use as high an oxidation temperature as possible. However, high temperature oxidation causes nitrogen atoms in a silicon nitride (hereinafter represented as SiN) film used as an oxidation mask to react with hydrogen atoms in moisture and generate ammonium. Ammonium diffuses in a silicon oxide film formed under the SiN film as a strain absorbing layer and reaches the silicon substrate surface.

On the silicon substrate surface, nitrogen atoms in ammonium react with the silicon substrate and form SiN. In this manner, SiN is formed on the surface of the silicon substrate near at the outer periphery of the SiN film used as the mask, i.e., near at the outer periphery of the field oxide film. Since this SiN is formed under the oxide film used as the strain absorbing layer, it can't be removed by the process of removing the SiN film used as the mask.

At the later process of forming a gate oxide film by thermal oxidation, this SiN functions as a mask so that a stripe region called a white ribbon is left near at the outer periphery of the field oxide film without being subjected to thermal oxidation. This stripe region lowers a breakdown voltage of the gate oxide film and deteriorates an element performance. In order to prevent generation of a white ribbon, a lower oxidation temperature is desired.

Conventionally, wet oxidation has been performed at a temperature of about 900° C. in order both to raise an oxidation speed and to prevent generation of a white ribbon.

A lateral oxidation speed is generally faster than a vertical oxidation speed at a temperature of about 900° C. Therefore, a bird's beak at the end of the field oxide film creeping under the SiN film and moving it up is likely to become long.

SUMMARY OF THE INVENTION

An object of the present invention is to provide a semiconductor device manufacturing technique capable of forming a field oxide film with a shorter bird's beak while maintaining a relatively fast oxidation speed and preventing generation of a white ribbon.

According to one aspect of the present invention, there is provided a method of manufacturing a semiconductor device including the steps of: (a) forming a mask layer of a desired pattern on a silicon substrate surface or on an $SiO_2$ strain absorbing layer formed on the silicon substrate surface; (b) selectively oxidizing the silicon substrate in a dry oxygen atmosphere by using the mask layer as an oxidation mask; and (c) selectively oxidizing the silicon substrate in an atmosphere of dry oxygen mixed with gas containing at least halogen element, wherein a field oxide film having a thickness of 100 nm or more is formed.

It is preferable that the first and second oxidation steps (b) and (c) are performed in a temperature range from 950° C. to 1200° C.

Oxidation In a dry oxygen atmosphere can prevent generation of a white ribbon. Oxidation at a temperature of the softening point of $SiO_2$ or higher can suppress generation of a bird's beak.

If oxidation is performed at a temperature of the softening point (950°–970° C.) of $SiO_2$ or higher without adding halogen element, heavy metals or the like may invade into the silicon substrate through a gel state $SiO_2$ film, and the silicon substrate is likely to be contaminated. In order to prevent such contamination, it is preferable that oxidizing atmosphere contains halogen element or the like having a gettering effect. In this case, however, If oxidation is performed by adding HCl, the surface of a silicon substrate is likely to become rough.

The first oxidation step is performed in an atmosphere containing only dry oxygen without adding halogen element. The second oxidation step is performed thereafter by adding halogen element. Therefore, heavy metals or the like invaded in the silicon substrate at the first oxidation step can be removed at the second oxidation step by the gettering effect provided by the halogen element.

Since the initial oxidation is performed only by dry oxygen without adding halogen element, the time required for the second oxidation step with added halogen element can be shortened. As a result, generation of a rough surface of the silicon substrate can be suppressed.

Halogen element contained in the oxidizing atmosphere at the later oxidation step can also reduce stacking faults generated by the initial oxidation step.

As above, a field oxide film can be formed without lowering throughput, while suppressing generation of a bird's beak and preventing generation of a white ribbon and roughness of the substrate surface.

BRIEF DESCRIPTION OF THE DRAWINGS

FIG. 2A and 2B are graphs showing temperatures and introduced gases during two kinds of the process of oxidizing a field oxide film by using time as a parameter, according to embodiments of the invention.

FIGS. 3A to 3D are plan views and cross sectional views sketched from scanning electron microscope (SEM) photographs of the surface of a substrate selectively oxidized by a field oxide film forming method according to an embodiment of the invention and the surface of a substrate selectively oxidized by a different method for comparison sake.

FIG. 5 is a graph showing proper regions of an oxidation temperature and an HCl concentration in the process of forming a field oxide film.

DETAILED DESCRIPTION OF THE PREFERRED EMBODIMENTS

Figure 1A:
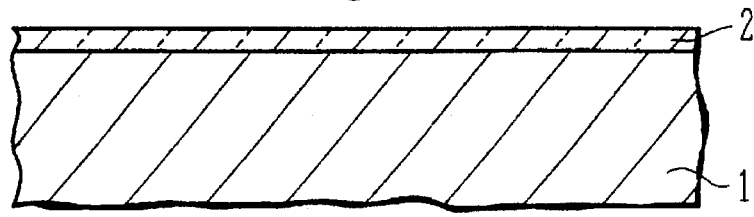
FIGS. 1A to 1D are cross sectional views of a substrate illustrating the main processes of a method of forming a field oxide film according to an embodiment of the invention.

LOCOS with dry oxidation at a high temperature of 1000° C. or higher has been proposed as a field oxide film forming method capable of preventing generation of a white ribbon and shortening a bird's beak, without lowering an oxidation speed.

$SiO_2$ has its softening point near at 950° to 970° C. Therefore, $SiO_2$ under oxidation at 1000° C. or higher is considered to be in a gel state. In comparison thereto, SiN has its softening point higher than that of $SiO_2$, and SiN used as a mask is not in a softened state during oxidation. Since $SiO_2$ during the oxidation process is in a gel state, the field oxide film becomes difficult to lift up and scrawl under the outer periphery of the SiN film. Therefore, generation of a bird's beak can be suppressed.

Hydrogen atoms don't exist in a dry oxygen atmosphere. It is therefore possible to prevent generation of ammonium which might otherwise be generated through bonding between hydrogen atoms and nitrogen atoms in an SiN film. It is therefore possible to prevent generation of a white ribbon.

High temperature LOCOS is, however, associated with the following problems.

A first problem is a lower oxidation speed of dry oxidation than wet oxidation. The thickness of a field oxide film is generally in the order of 0.1 to 1.0 μm, and the oxidation process of the field oxide film is required to form a thicker film than other films such as a gate oxide film. The oxidation speed, therefore, greatly affects throughput. It is preferable to set as high an oxidation temperature as possible in order to speed up oxidation.

A second problem is possible contamination of the surface of a silicon substrate because oxidation is performed at a softening point of $SiO_2$ or higher and impurities such as heavy metals are likely to invade into the Si substrate. In order to prevent contamination by heavy metals or the like, it is preferable that oxidizing atmosphere contains an element such as Cl having a gettering effect.

A third problem resides in that stacking faults become likely to be formed. Volume expansion occurs when Si transforms into $SiO_2$ during the oxidation process, and Si not oxidized enters the Si substrate. As these surplus Si atoms are captured by crystal defects in the Si substrate, stacking faults are generated and grown. The greater the oxygen amount in an oxidizing atmosphere, the more the stacking faults become likely to be formed.

It is known that generation of stacking faults can be suppressed by adding HCl because it removes surplus Si atoms. It is also known that the higher the HCl concentration, the suppressing effect becomes more effective. In an atmosphere with a constant HCl concentration, stacking faults become more likely to be formed as the oxidation temperature is lowered. In order to suppress generation of stacking faults, it is therefore preferable to raise an oxidation temperature and increase an HCl concentration.

A fourth problem is that high temperature dry oxidation with HCl makes the surface of an Si substrate rough. This phenomenon may be related to stress in an SiN film used as a mask and chemical reaction between HCl and Si. The degree of roughness of the Si substrate surface tends to become greater as the HCl concentration is increased. If dry oxidation is performed without adding HCl, the surface of an Si substrate is not made rough. In order to prevent generation of a rough surface of an Si substrate, it is preferable to lower the oxidation temperature and HCl concentration.

The inventors have found by experiments that the HCl concentration should be 1 volume % or less.

FIG. 5 is a graph showing proper regions of oxidation temperatures and HCl concentrations for forming a field oxide film having a desired quality while solving the first to fourth problems. The abscissa represents an oxidation temperature in ° C., and the ordinate represents a concentration of HCl in an oxidizing atmosphere in %.

In order to escape from the first problem, the right hand side region of a curve p1 is preferred. In order to escape from the second problem, the upper region of a curve p2 is preferred. In order to escape from the third problem, the right hand side region of a curve p3 is preferred. In order to escape from the fourth problem, the lower region of a curve p4 is preferred.

As seen from FIG. 5, there is no region which satisfies these four conditions. A field oxide film having a desired quality can not be formed therefore under a single oxidation condition.

Next, an embodiment of the invention will be described with reference to FIGS. 1A to 1D illustrating the main processes of a field oxide film forming method.

As shown in FIG. 1A, on the surface of an Si substrate 1, a strain absorbing oxide film 2 is formed to a thickness of 20 nm by thermal oxidation.

Figure 1B:
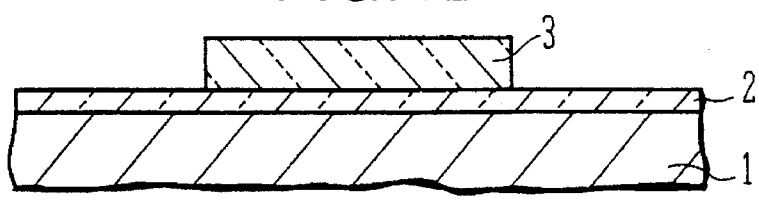

As shown in FIG. 1B, an SiN film 3 is deposited on the oxide film 2 to a thickness of 120 nm by chemical vapor deposition (CVD). At this time, the oxide film 2 functions as a strain absorbing film. The SiN film at the region on which a field oxide film is to be formed is removed by photolithography and reactive ion etching (RIE).

Figure 1C:
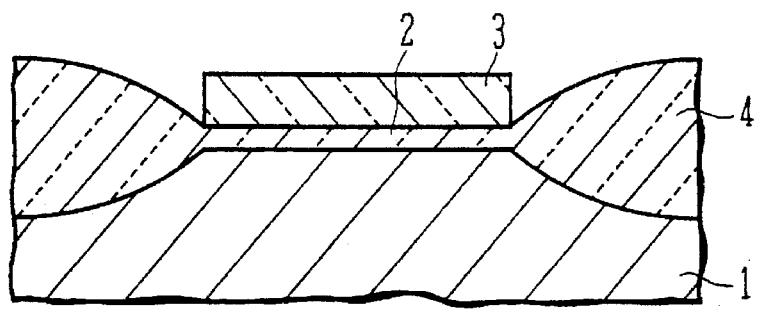

As shown in FIG. 1C, by using the SiN film 3 as a mask, a field oxide film 4 is formed by selectively oxidizing the Si substrate by an oxidation process to be described later.

Figure 1D:
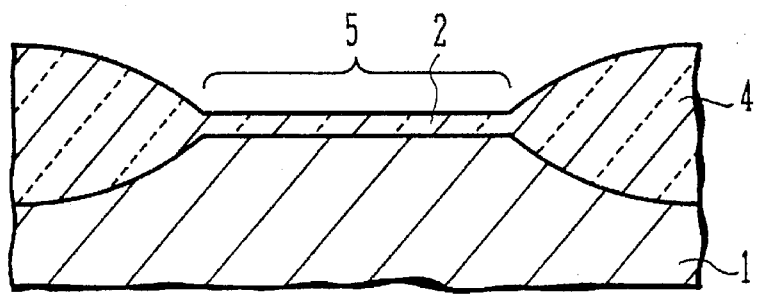

As shown in FIG. 1D, the SiN film 3 is removed to expose an active region 5. Thereafter, the oxide film 2 on the surface of the active region 5 is removed to form a semiconductor element.

FIG. 2A is a sequence diagram of temperatures and gases used in the oxidation process described with FIG. 1C. The abscissa represents a lapse time, and the ordinate represents a temperature in a furnace. The length of a lapse time at the abscissa of FIG. 2A is not proportional with a real lapse time, because the diagram is being depicted putting main emphasis upon the temperature change and the type of introduced gas. In this embodiment, rapid thermal oxidation is performed by lamp heating. Oxidation may be performed by using a lateral or vertical type electric furnace.

First, a temperature in the furnace is raised to a steady temperature of 750° C. while $N_2$ gas of 10000 sccm is flowed. Next, after introduction of $N_2$ gas is stopped, the $N_2$ gas in the furnace is purged by Ar gas at a flow rate of 9800 sccm and $O_2$ gas at a flow rate of 200 sccm. The substrate with the oxide film 2 and patterned SiN film 3 shown in FIG. 1B is placed inside of the furnace. The temperature is then raised to 1000° C. at a speed of 10° C./min, and the furnace is maintained at 1000° C. for about 30 minutes. Here, mixing $O_2$ in Ar prevents toughening of the substrate surface, due to slight oxidation.

Next, introduction of Ar gas is stopped, and oxidation is performed for about 1 hour and 10 minutes at a flow rate of $O_2$ gas of 10000 sccm while maintaining the temperature at 1000° C. This oxidation at a relatively low temperature serves to relax stress in the SiN film.

At an Ar gas flow rate of 7000 sccm and an $O_2$ gas flow rate of 3000 sccm, the temperature is raised to a temperature higher than 1000° C. by 100° C. or more, e.g., 1125° C., at a speed of 10° C./min. Introduction of $O_2$ gas is stopped, and the Ar gas flow rate of 10000 sccm is maintained for about 9 minutes and 45 seconds to reach a thermally steady state. Introduction of Ar gas is stopped, and oxidation is performed for about 2 hours and 40 minutes at the $O_2$ gas flow rate of 10000 sccm.

Oxidation up to this point is done by dry oxygen without adding halogen element, and may be called as first oxidation. In this embodiment, the first oxidation includes front stage oxidation at 1000° C., middle stage while the temperature is raised and stabilized, and back stage oxidation at 1125° C.

While the $O_2$ gas flow rate is maintained at 10000 sccm, HCl gas is flowed at a flow rate of 25 sccm. This state is maintained for about 3 hours to oxidize the substrate while chlorine is supplied. This oxidation with HCl (halogen) may be called second oxidation.

Supply of $O_2$ and HCl gases is stopped, and the substrate is annealed for about 10 minutes while flowing Ar gas at a flow rate of 10000 sccm. Thereafter, the temperature is lowered to 900° C. at a speed of 2.5° C./min, and further lowered to 750° C. at a speed of 2° C./min. The substrate is then taken out of the furnace. Thereafter, introduction of Ar gas is stopped and $N_2$ gas is flowed at a flow rate of 10000 sccm. Under the above conditions, a field oxide film having a thickness of about 400 nm was able to be formed.

Figure 3A:
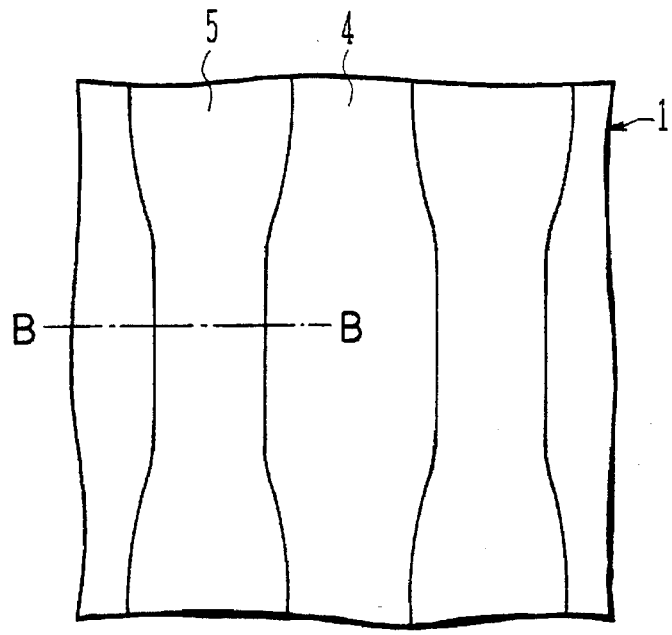
Figure 3B:
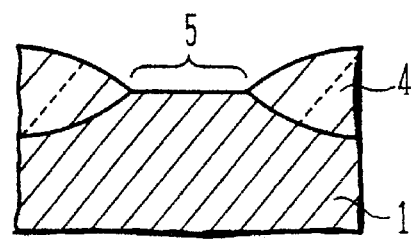
Figure 3B:
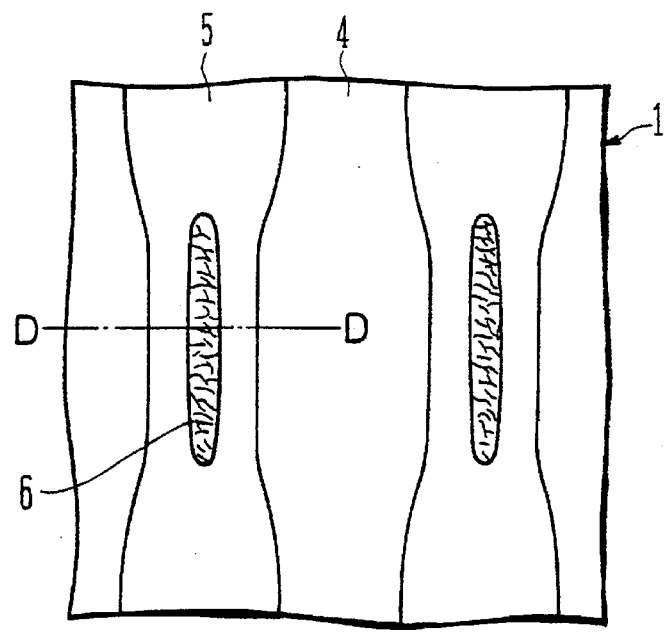
Figure 3B:
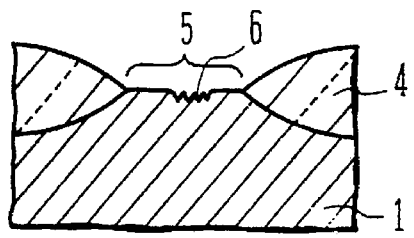

FIG. 3A is a plan view of the surface of a substrate subjected to selective oxidation of the above embodiment, as sketched from an SEM photograph, and FIG. 3B is a cross sectional diagram taken along one-dot chain line B—B. A plurality of field oxide film stripes 4 longer in the vertical direction are formed on the surface of the Si substrate 1. Active regions 5 are defined between two adjacent field oxide films 4. A mask pattern periodically repeating wider and narrower areas was used so that corresponding wider and narrower areas are being formed in the field oxide films 4 and active regions 5.

For the comparison purpose, a reference sample was formed by using the same mask pattern as the above embodiment, by initial oxidation through introduction of $O_2$ gas containing 0.3% HCl gas, and by succeeding oxidation through introduction of only $O_2$ gas without flowing HCl gas.

FIG. 3C is a plan view of the surface of a substrate subjected to selective oxidation for the above reference sample, as sketched from an SEM photograph, and FIG. 3D is a cross sectional diagram taken along one-dot chain line D—D.

As shown in FIGS. 3C and 3D, a rough surface 6 of the substrate can be observed generally at the center of the narrower area of the active region 5. This rough surface adversely affects a gate oxide film to be formed at a later process. No rough surface is observed in the active region of the substrate of this embodiment, as shown in FIGS. 3A and 3B.

A rough surface of an Si substrate can be avoided, as described above, by first oxidizing the substrate only by $O_2$ and then oxidizing it by adding HCl. As described earlier, although a rough surface of the Si substrate is easily formed by the oxidation process using added HCl, the period while the substrate is exposed to HCl atmosphere in this embodiment is much shortened as compared to the case where a substrate is exposed to HCl atmosphere for the whole period of oxidation. This may be ascribed to suppression of a rough surface of an Si substrate.

Also as stated earlier, if $O_2$ only is used for oxidation, stacking faults as well as contamination by heavy metals or the like are likely to occur. This problem is considered to be solved by later oxidation with added HCl. Specifically, stacking faults formed during oxidation by $O_2$ only may be considered to be reduced by the later oxidation process with added HCl. Contamination by heavy metals or the like may also be considered to be removed by the gettering effect of the later oxidation process with added HCl.

Furthermore, oxidation at a high temperature of 1125° C. provides a relatively high oxidation speed, realizing substantially the same throughput as wet oxidation.

Figure 2B:
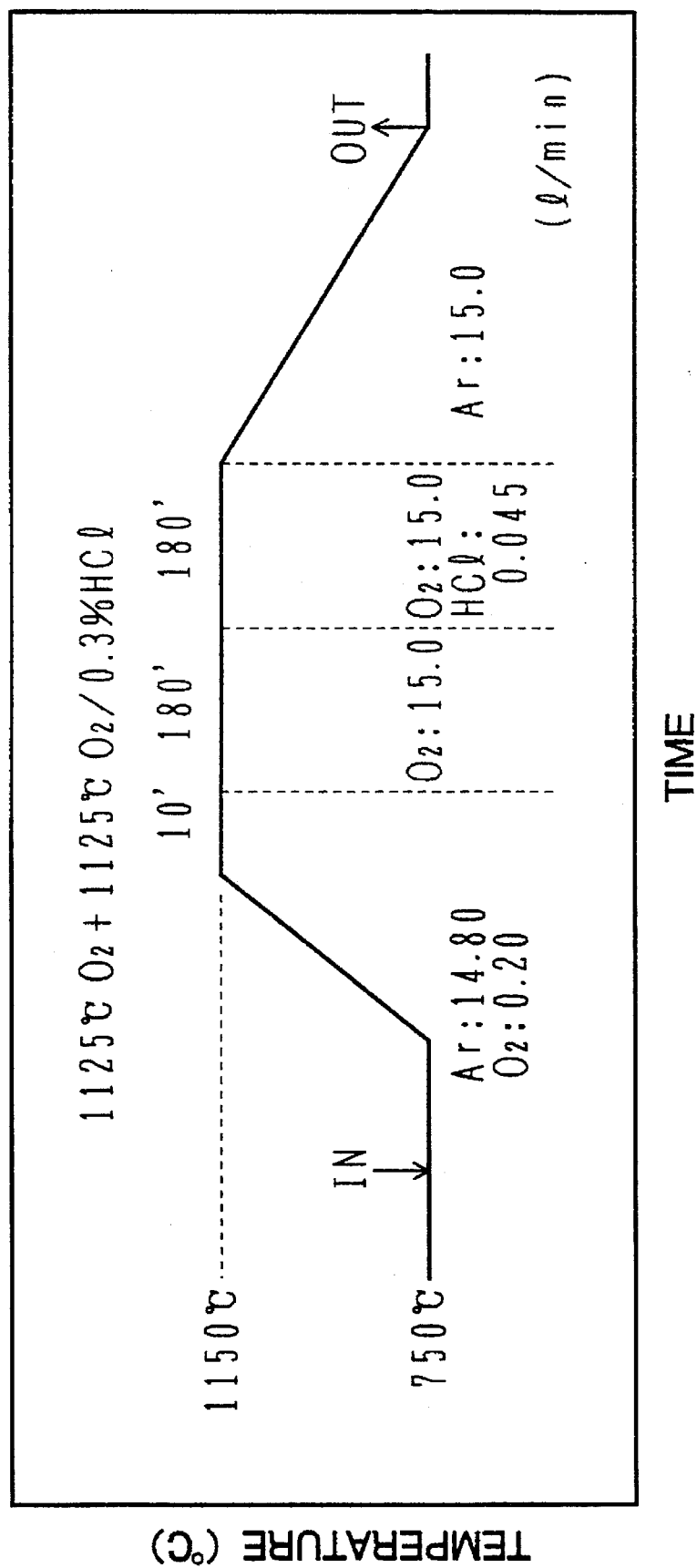

FIG. 2B shows a simplified sequence of oxidation according to another embodiment of this invention. The abscissa represents lapse of time and the ordinate represents temperature, similar to FIG. 2A.

First, the furnace is kept at 750° C., while Ar and $O_2$ are flowed at flow rates of 14.80 l/min and 0.2 l/min, respectively. A substrate or substrates as shown in FIG. 1B are loaded in this state. After the furnace temperature is recovered, the furnace temperature is raised to 1150° C. and kept at 1150° C. for 10 minutes for stabilizing the temperature.

Then, supply of Ar+$O_2$ gas is stopped and only $O_2$ gas at a flow rate of 15.0 l/min is supplied for 180 minutes. This step constitutes the main portion of dry oxidation.

Then, supply of $O_2$ gas is changed to supply of $O_2$ and HCl gas at flow rates of 15.0 l/min and 0.045 l/min, respectively. Oxidation with HCl is continued for 180 minutes.

Thereafter, supply of $O_2$+HCl gas is stopped and Ar gas is supplied at a flow rate of 15.0 l/min. Temperature is lowered to 750° C., and the substrates are taken out.

In the above embodiments, the oxidation temperature is set to 1125° C. and 1150° C. Similar advantageous effects may be obtained at a temperature of the softening point of $SiO_2$ of 950° C. or higher. Mechanism of oxidation does not limit the upper temperature, but a temperature of 1200° C. or lower is preferable for preventing deformation of jigs in the furnace.

Next, the field oxide film forming method of this embodiment as applied to a DRAM will be described with reference to FIG. 4.

Figure 4:
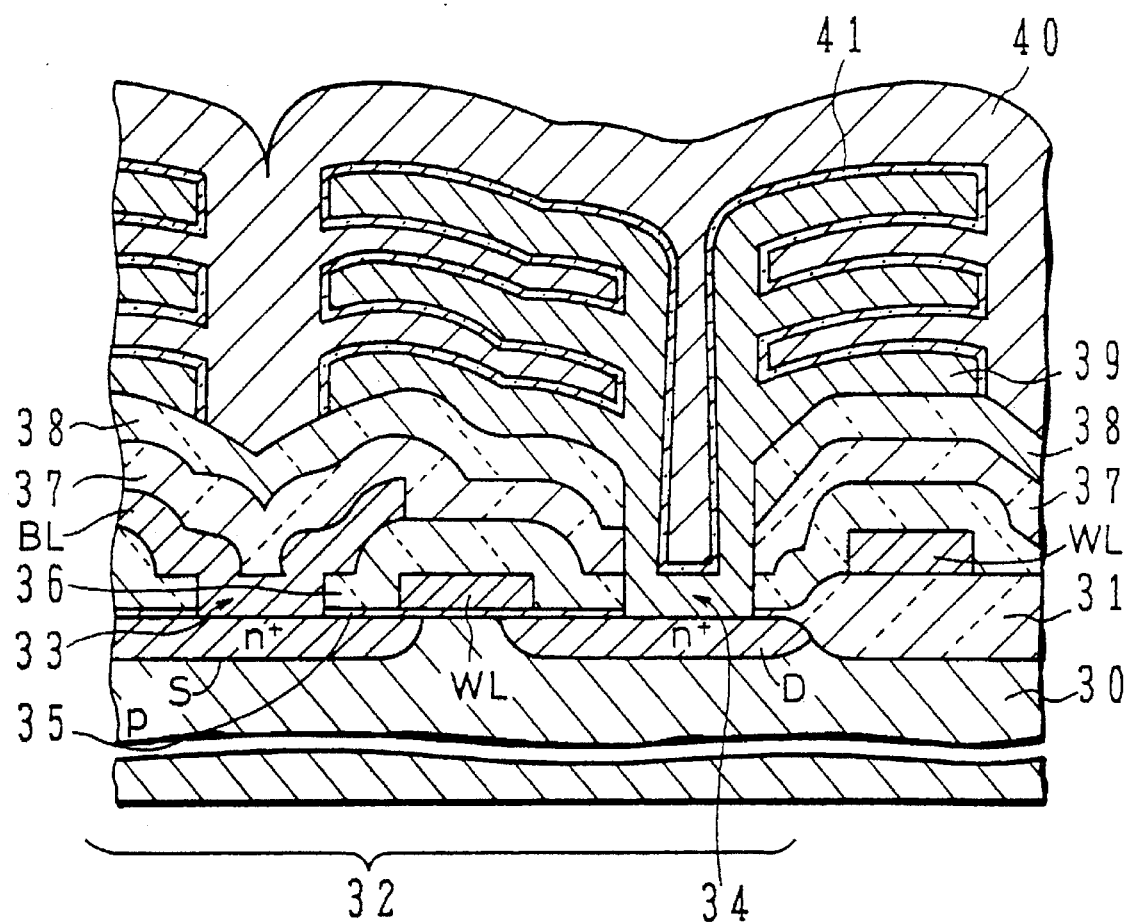
FIG. 4 is a cross sectional view of a DRAM fabricated by using a field oxide film forming method according to an embodiment of the invention.

FIG. 4 is a cross sectional view of a DRAM. On the surface of a p-type silicon substrate 30, a field oxide film 31 is formed by either of the embodiment methods to define an active region 32. An n-channel MOS transistor is formed in the active region 32, which transistor is constituted with an $n^+$-type source region S and drain region D, a gate insulating film 35, and a gate electrode (word line) WL formed on the gate insulating film 35. The gate electrode (word line) WL extends in the direction perpendicular to the surface of the drawing sheet.

The source region S is connected to a bit line BL extending in the lateral direction of the drawing sheet, via a bit line contact hole 33 formed in an insulating film 36 covering the word line WL and gate insulating film 35.

On the bit line BL and insulating film 36, a laminate of insulating films 37 and 38 is formed. A storage electrode 39, for example of polycrystalline silicon, is connected to the drain region D via a storage contact hole 34 formed in the gate insulating film 35 and insulating films 36 to 38. The storage electrode 39 is formed by a cylindrical shaft portion extending upward from the storage contact hole 34 and three fins which extend from the shaft portion along the plane generally in parallel to the substrate surface.

A dielectric film 41 of silicon oxide or nitride is formed covering the surface of the storage electrode 39. A cell plate 40, for example of polycrystalline silicon, is formed on the surface of the dielectric film 41. An electrostatic capacitance between the storage electrode 39 and cell plate 40 can be increased by increasing the area of the interface therebetween.

Although HCl is used in the above embodiments as gas containing halogen element, trichloroethane $C_2H_3Cl_3$, dichloroethylene $C_2H_2Cl_2$, and chlorine $Cl_2$ may also be used as well, as the gas containing halogen element.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A method of manufacturing a semiconductor device comprising the steps of:
    (a) forming a mask layer of a desired pattern on a silicon substrate surface or on an $SiO_2$ strain absorbing layer formed on said silicon substrate surface;
    (b) selectively oxidizing said silicon substrate in a dry oxygen atmosphere without adding halogen element by using said mask layer as an oxidation mask; and
    (c) selectively oxidizing said silicon substrate in an atmosphere of dry oxygen mixed with gas containing halogen element,
    wherein each of said first and second oxidizing steps (b) and (c) includes oxidation at a temperature between about 1050° C. and 1200° C., said gas containing halogen element has a concentration of 1 V % or less, and a field oxide film having a thickness of 100 nm or more is formed.

2. A method according to claim 1, wherein said second oxidizing step (c) is performed continuously after the end of said first oxidizing step (b), in an oxidizing atmosphere of said first oxidizing step (b) added with gas containing halogen element.

3. A method according to claim 1, wherein said gas containing halogen element is HCl, $C_2H_3Cl_3$, $C_2H_2Cl_2$, or $Cl_2$ gas.

4. A method according to claim 1, wherein said first oxidizing step (b) includes a front stage to be done at a first temperature and a back stage to be done at a second temperature higher than said first temperature, said first temperature being in a range from 950° C. to 1200° C.

5. A method according to claim 4, wherein said first oxidizing step (b) includes a middle stage for raising a temperature in an atmosphere containing inert gas, between said front and back stages.

6. A method according to claim 5, wherein said first oxidizing step (b) includes a stabilizing stage for reaching a steady state by maintaining said second temperature in an inert gas atmosphere, between said middle stage and back stage.

7. A method according to claim 4, wherein said second temperature is higher by about 100° C. or more than said first temperature.

8. A method of manufacturing a semiconductor device comprising the steps of:
    (a) oxidizing a silicon substrate in a dry oxygen atmosphere without adding halogen element; and
    (b) oxidizing said silicon substrate in an atmosphere of dry oxygen added with gas containing halogen element, wherein each of said first and second oxidizing steps (a) and (b) includes oxidation at a temperature between about 1050° C. and 1200° C., and said gas containing halogen element has a concentration of 1 V % or less.

9. A method according to claim 8, wherein said second oxidizing step (b) is performed continuously after the end of said first oxidizing step (a), at the same temperature, in an oxidizing atmosphere of said first oxidizing step (a) added with gas containing halogen element.

10. A method according to claim 8, wherein said gas containing halogen element is HCl, $C_2H_3Cl_3$, $C_2H_2Cl_2$, or $Cl_2$ gas.

11. A method according to claim 8, wherein said first oxidizing step (a) includes a front stage to be done at a first temperature and a back stage to be done at a second temperature higher than said first temperature.

12. A method according to claim 11, wherein said first oxidizing step (a) includes a middle stage for raising a temperature in an atmosphere containing inert gas, between said front and back stages.

13. A method according to claim 12, wherein said first oxidizing step (a) includes a stabilizing stage for reaching a steady state by maintaining said second temperature in an inert gas atmosphere, between said middle stage and back stage.

14. A method according to claim 11, wherein said second temperature is higher by about 100° C. or more than said first temperature.

15. A method according to claim 1, wherein said temperature is between about 1100° C. and 1200° C.

16. A method according to claim 1, wherein said oxidations are performed at the same temperature.

17. A method according to claim 9, wherein said same temperature is in a range between 1100° C. and 1200° C.

* * * * *